(12) United States Patent
Oyamada et al.

(10) Patent No.: US 10,529,683 B2
(45) Date of Patent: Jan. 7, 2020

(54) BONDING WIRE FOR SEMICONDUCTOR DEVICE

(71) Applicants: NIPPON STEEL CHEMICAL & MATERIAL CO., LTD., Tokyo (JP); NIPPON MICROMETAL CORPORATION, Saitama (JP)

(72) Inventors: Tetsuya Oyamada, Tokyo (JP); Tomohiro Uno, Tokyo (JP); Daizo Oda, Saitama (JP); Takashi Yamada, Saitama (JP)

(73) Assignees: NIPPON STEEL CHEMICAL & MATERIAL CO., LTD., Tokyo (JP); NIPPON MICROMETAL CORPORATION, Saitama (JP)

( * ) Notice: Subject to any disclaimer, the term of this patent is extended or adjusted under 35 U.S.C. 154(b) by 0 days.

(21) Appl. No.: 16/062,084

(22) PCT Filed: Jun. 24, 2016

(86) PCT No.: PCT/JP2016/068764
§ 371 (c)(1),
(2) Date: Jun. 13, 2018

(87) PCT Pub. No.: WO2017/104153
PCT Pub. Date: Jun. 22, 2017

(65) Prior Publication Data
US 2018/0374815 A1 Dec. 27, 2018

(30) Foreign Application Priority Data

Dec. 15, 2015 (JP) .................................. 2015-244358

(51) Int. Cl.
| | | |
|---|---|---|
| H01L 23/00 | (2006.01) | |
| C22C 9/04 | (2006.01) | |
| C22C 9/06 | (2006.01) | |
| B23K 35/30 | (2006.01) | |
| B32B 15/01 | (2006.01) | |
| B32B 15/20 | (2006.01) | |

(52) U.S. Cl.
CPC ............ *H01L 24/45* (2013.01); *B23K 35/302* (2013.01); *B32B 15/018* (2013.01); *B32B 15/20* (2013.01); *C22C 9/04* (2013.01); *C22C 9/06* (2013.01); *H01L 2224/05624* (2013.01); *H01L 2224/43848* (2013.01); *H01L 2224/45015* (2013.01); *H01L 2224/45147* (2013.01); *H01L 2224/45565* (2013.01); *H01L 2224/45572* (2013.01); *H01L 2224/45644* (2013.01); *H01L 2224/45664* (2013.01); *H01L 2224/48247* (2013.01); *H01L 2224/85439* (2013.01); *H01L 2924/10253* (2013.01)

(58) Field of Classification Search
CPC ....................................................... H01L 24/45
See application file for complete search history.

(56) References Cited

U.S. PATENT DOCUMENTS

| | | | | |
|---|---|---|---|---|
| 7,820,913 | B2 * | 10/2010 | Uno ..................... | B23K 20/004 174/94 R |
| 8,102,061 | B2 * | 1/2012 | Uno ......................... | H01L 24/43 257/784 |
| 8,653,668 | B2 * | 2/2014 | Uno ......................... | H01L 24/48 257/734 |
| 2009/0188696 | A1 | 7/2009 | Uno et al. | |
| 2010/0327450 | A1 * | 12/2010 | Uno ......................... | H01L 24/43 257/762 |
| 2011/0120594 | A1 * | 5/2011 | Uno ..................... | B32B 15/018 148/23 |
| 2012/0118610 | A1 * | 5/2012 | Terashima ................ | C22C 5/02 174/126.2 |
| 2012/0292774 | A1 * | 11/2012 | Itoh ......................... | H01L 24/85 257/769 |
| 2016/0126208 | A1 * | 5/2016 | Lee ......................... | H01L 24/45 257/762 |

FOREIGN PATENT DOCUMENTS

| | | |
|---|---|---|
| JP | S61-48543 A | 3/1986 |
| JP | 2005-167020 A | 6/2005 |
| JP | 2006-190763 A | 7/2006 |
| JP | 2012-036490 A | 2/2012 |
| WO | 2015/163297 A1 | 10/2015 |

OTHER PUBLICATIONS

Search Report issued in corresponding International Patent Application No. PCT/JP2016/068764, dated Sep. 13, 2016.

* cited by examiner

*Primary Examiner* — Eugene Lee
(74) *Attorney, Agent, or Firm* — McDermott Will & Emery LLP

(57) ABSTRACT

A bonding wire for a semiconductor device, which is suitable for on-vehicle devices bonding wire, has excellent capillary wear resistance and surface flaw resistance while ensuring high bonding reliability and further satisfies overall performance including ball formability and wedge bondability, the bonding wire including: a Cu alloy core material; a Pd coating layer formed on a surface of the Cu alloy core material; and a Cu surface layer formed on a surface of the Pd coating layer, in which the bonding wire for semiconductor device contains Ni, a concentration of the Ni in the bonding wire is 0.1 to 1.2 wt. %, the Pd coating layer is 0.015 to 0.150 μm in thickness, and the Cu surface layer is 0.0005 to 0.0070 μm in thickness.

5 Claims, No Drawings

BONDING WIRE FOR SEMICONDUCTOR DEVICE

CROSS REFERENCE

This application is the U.S. National Phase under 35 U.S.C. § 371 of International Application No. PCT/JP2016/068764, filed on Jun. 24, 2016, which claims the benefit of Japanese Application No. 2015-244358, filed on Dec. 15, 2015, the entire contents of each are hereby incorporated by reference.

TECHNICAL FIELD

The present invention relates to a bonding wire for semiconductor device used to connect electrodes on semiconductor elements with wiring of a circuit wiring board such as external leads.

BACKGROUND ART

Currently, as bonding wires for semiconductor devices (hereinafter referred to as "bonding wires") for bonding electrodes on semiconductor elements with external leads, fine wires approximately 15 to 50 μm in wire diameter are mainly used. As a method for bonding the bonding wire, a thermosonic bonding technique is used commonly, and a capillary is used on a general-purpose bonding machine, as a jig used to connect a bonding wire passed therethrough. A bonding wire bonding process involves heat-melting a wire tip by arc heat input, forming a ball by surface tension, followed by crimp-bonding the ball portion (hereinafter referred to as "ball bonding") onto an electrode of a semiconductor element heated in a range of 150 to 300° C., then forming a loop, and crimp-bonding a wire portion to an electrode on the side of the external lead (hereinafter referred to as "wedge bonding") to complete the process. An electrode structure in which an alloy film composed principally of Al is formed on a Si substrate is mainly used for the electrode on the semiconductor element to which the bonding wire is bonded while an electrode structure plated with Ag or Pd is mainly used for the electrode on the side of the external lead.

Au has mainly been used as a bonding wire material because of excellent oxidation resistance and good bondability of Au. However, due to recent escalation of Au prices, there has been demand for development of a less expensive, and a highly functional bonding wire. In response to this demand, a bonding wire made of Cu is proposed by taking advantage of low cost and high electric conductivity. Regarding the bonding wire made of Cu, bonding wires made of high-purity Cu (with a purity of 99.99 wt. % or above) are proposed (e.g., Patent Literature 1). The Cu bonding wire made of high-purity Cu offers the advantage of having excellent electric conductivity and other advantages, but has problems in that bondability is deteriorated by surface oxidation, that the life of ball bonds (hereinafter referred to as "bonding reliability") in high-temperature and high-humidity environments is shorter than an Au bonding wire, and so on. As a technique for solving the above problems, a bonding wire produced by coating a surface of a Cu alloy core material with Pd (hereinafter referred to as a "Pd-coated Cu bonding wire") has been proposed (e.g., Patent Literature 2 and Patent Literature 3). By coating the Cu alloy core material with Pd having excellent oxidation resistance, the Pd-coated Cu bonding wire features excellent bondability and improved bonding reliability in high-temperature and high-humidity environments as well.

CITATION LIST

Patent Literature

[Patent Literature 1] Japanese Patent Laid-Open No. 61-48543
[Patent Literature 2] Japanese Patent Laid-Open No. 2005-167020
[Patent Literature 3] Japanese Patent Laid-Open No. 2012-36490

SUMMARY OF INVENTION

Technical Problem

The Pd-coated Cu bonding wire has been put to practical use mainly in LSI applications. In the future, there is demand for replacement of the Au bonding wire with the Pd-coated Cu bonding wire in on-vehicle devices which have more stringent performance requirements.

On-vehicle devices are required to ensure operating performance in high-temperature and high-humidity environments for longer periods of time than typical electronic devices. When conventional Pd-coated Cu bonding wires are used, it is difficult to satisfy bonding reliability standards required for on-vehicle devices. Therefore, in applying the Pd-coated Cu bonding wire to on-vehicle devices, it is necessary to further improve bonding reliability in high-temperature and high-humidity environments.

Also, with enhancement and growth in the functionality of electric cars and hybrid cars, on-vehicle devices increasingly use high-density packaging. As a result of high-density packaging, the bonding wire used is reduced in wire diameter, and consequently there is demand to deal with new problems resulting from the reduction in wire diameter. Specifically, there is demand for capillary wear resistance and surface flaw resistance.

Capillary wear is a phenomenon in which a capillary is worn by contact between the bonding wire and capillary during bonding of the bonding wire. Generally, the capillary has a circular hole at the tip, but when the capillary is worn, thereby the shape of the hole becomes elliptical. As the shape of the capillary hole becomes elliptical, ball formation defects are liable to occur. In particular, ball formability tends to become unstable with increasing reductions in bonding wire diameter, and consequently there is demand to improve capillary wear resistance.

Surface flaws are a phenomenon in which flaws occur in part of the surface of the bonding wire in a contact between the bonding wire and capillary during bonding of the bonding wire. For example, if surface flaws occur in a loop portion, stresses concentrate on recesses of the surface flaws, causing loop shape variation. In particular, with increasing reductions in bonding wire diameter, the impact of surface flaws on loop shape increases, and consequently there is demand to improve surface flaw resistance.

The Pd-coated Cu bonding wire, which is produced by coating a surface of a Cu alloy core material with Pd higher in hardness than Au, is more liable to capillary wear than the Au bonding wire. As a method for reducing capillary wear, it is considered useful, for example, to reduce the thickness of a Pd coating layer, but the reduction in the thickness of the Pd coating layer reduces the hardness of the bonding wire surface, resulting in increased surface flaws. Therefore, in order to apply the Pd-coated Cu bonding wire to on-vehicle devices, there is demand to improve capillary wear resistance and surface flaw resistance to excellent levels at the same time.

Thus, in applying the Pd-coated Cu bonding wire to on-vehicle devices, there is demand to achieve excellent capillary wear resistance and surface flaw resistance while ensuring high bonding reliability.

The present inventors evaluated conventional Pd-coated Cu bonding wires by taking into consideration characteristics required by on-vehicle devices, and found that problems in practical use were left as described later.

First, problems in evaluating the bonding reliability will be described in detail. The evaluation of bonding reliability is carried out for the purpose of accelerated evaluation of semiconductor device life. In evaluating the bonding reliability, a high temperature shelf test and a high temperature and high humidity test are generally used to accelerate a defect generating mechanism in an operating environment of semiconductors. For bonding reliability evaluation in a high temperature and high humidity environment, a test known as uHAST (unbiased-highly accelerated test) is used, being conducted under test conditions of 130° C. in temperature and 85% in relative humidity. When an operating environment of typical electronic devices is assumed, a bonding reliability of 150 hours or more in uHAST is required, but when an operating environment of on-vehicle devices is assumed, a bonding reliability of 250 hours or more in uHAST is required.

Using a commercially available wire bonder, a conventional Pd-coated Cu bonding wire was ball-bonded to an electrode formed by forming a film of pure Al on a Si substrate on a typical metal frame and sealed by epoxy resin. A sample thus obtained was evaluated for bonding reliability using uHAST, and it was found as a result that separation had occurred in a bonding interface of a ball bond in less than 250 hours, reducing bonding strength, and thereby failing to provide the bonding reliability required by on-vehicle devices. When the bonding interface in which the separation occurred was observed closely, plural intermetallic compounds composed principally of Al and Cu had been formed and it was presumed that $Cu_9Al_4$ out of the intermetallic compounds had been corroded preferentially by chlorine contained in the sealing resin, causing the reduction in bonding strength.

Next, problems with capillary wear resistance and surface flaw resistance will be described in detail. Bonding wire bonding steps in which capillary wear and surface flaws occur include a ball bonding step, wedge bonding step, and loop forming step, in which the bonding wire and capillary come into contact. Of these bonding steps, capillary wear and surface flaws are most liable to occur in the loop forming step. This is because the duration in which the bonding wire is in contact with the inner wall of the capillary hole is longer than in the other steps. The likelihood of occurrence of capillary wear and surface flaws is affected by mechanical properties of the bonding wire surface, an irregular shape on the bonding wire surface, lubricity, and the like. In particular, the hardness of the bonding wire surface greatly affects occurrence of capillary wear and surface flaws. The higher the hardness of the bonding wire surface, the more liable the capillary is to wear while the lower the hardness, the more liable the surface flaws are to occur. The capillary wear resistance can be determined based on the occurrence frequency of ball formation defects when balls are formed after the bonding wire is bonded a fixed number of times. The reason why the occurrence frequency of ball formation defects is used to evaluate the capillary wear resistance is that when the capillary is worn, a gap is created between the bonding wire and capillary, causing a ball formation defect (hereinafter referred to as "eccentricity") in which the center-of-gravity position of the ball deviates from the central axis of the wire. This method allows the capillary wear resistance to be evaluated in a relatively simple and easy manner. The surface flaw resistance can be determined based on the occurrence frequency of surface flaws in the loop portion after the bonding wire is bonded.

As a rule-of-thumb for the capillary wear resistance required by on-vehicle devices, the number of occurrences of eccentricity is 2 or less when 100 balls are formed after a bonding wire with a wire diameter of $\phi$ 20 μm is bonded 5000 times. Similarly, as a rule-of-thumb for surface flaw resistance required by on-vehicle devices, the number of surface flaws occurred is three or less when 100 loop portions are observed after a bonding wire with a wire diameter of $\phi$ 20 μm is bonded. The capillary used for these evaluations is commercially available and is mainly composed of $Al_2O_3$.

The evaluations described above were made using the conventional Pd-coated Cu bonding wire. As a result, when the Pd coating layer was thick, eccentricity occurred in 3 or more out of 100 balls after 5000 times of bonding. At this time, the hole shape at the tip of the capillary deformed into an elliptical shape. When the Pd coating layer was thin, the bonding wire surfaces in 100 loop portions were observed and surface flaws were found in 4 or more loop portions. From these results, it was found that the conventional Pd-coated Cu bonding wire did not provide the performance required by on-vehicle devices.

Thus, an object of the present invention is to provide a bonding wire for semiconductor device which has excellent capillary wear resistance and surface flaw resistance while ensuring high bonding reliability and is suitable for on-vehicle devices.

Solution to Problem

A bonding wire for a semiconductor device according to the present invention includes: a Cu alloy core material; a Pd coating layer formed on a surface of the Cu alloy core material; and a Cu surface layer formed on a surface of the Pd coating layer, wherein the bonding wire contains Ni, a concentration of the Ni in the bonding wire is 0.1 to 1.2 wt. %, the Pd coating layer is 0.015 to 0.150 μm in thickness, and the Cu surface layer is 0.0005 to 0.0070 μm in thickness.

Advantageous Effects of Invention

The present invention provides a bonding wire which has excellent capillary wear resistance and surface flaw resistance while ensuring high bonding reliability and is suitable for on-vehicle devices.

DESCRIPTION OF EMBODIMENTS

An embodiment of the present invention will be described in detail below.

1. Embodiment (Overall Configuration)

A bonding wire according to an embodiment of the present invention includes: a Cu alloy core material; a Pd coating layer formed on a surface of the Cu alloy core material; and a Cu surface layer formed on a surface of the Pd coating layer, wherein the bonding wire for semiconductor device contains Ni, a concentration of the Ni in the entire wire is 0.1 to 1.2 wt. %, the Pd coating layer is 0.015 to 0.150 μm in thickness, and the Cu surface layer is 0.0005 to 0.0070 μm in thickness. The bonding wire according to the embodiment of the present invention has excellent capillary wear resistance and surface flaw resistance while ensuring high bonding reliability and is suitable for on-vehicle devices. Furthermore, the bonding wire according to the embodiment of the present invention satisfies overall performance including ball formability and wedge bondability.

Effectiveness of the bonding wire according to the embodiment of the present invention for improvement of bonding reliability will be described. The bonding wire according to the embodiment of the present invention can improve the bonding reliability by including a Cu alloy core material, a Pd coating layer formed on a surface of the Cu alloy core material, and a Cu surface layer formed on a surface of the Pd coating layer and containing Ni. This allows the bonding wire according to the embodiment of the present invention to satisfy bonding reliability required by on-vehicle devices in the uHAST-based evaluation of bonding reliability.

When a ball is formed using the bonding wire according to the embodiment of the present invention, an alloy layer higher in Pd and Ni concentrations than the inside of the ball is formed on a surface of the ball in a process in which the bonding wire melts and solidifies. In order to form a region high in Pd and Ni concentrations on the surface of the ball, it is useful that the bonding wire has a Pd coating layer on the surface of the Cu alloy core material, further has a Cu surface layer on the surface of Pd coating layer, and further contains Ni in the bonding wire. Presumably, this is due to the effects whereby Pd is supplied to the ball surface from the Pd coating layer formed on the surface of the Cu alloy core material and the Ni contained in the bonding wire is supplied to the ball surface through the Cu surface layer during formation of the ball.

When the ball is used for ball bonding of an Al electrode and a high temperature and high humidity test is conducted, a region which is high in Pd and Ni concentrations is formed in an interface between the ball and Al electrode. The region which is formed in the interface of the ball bond and is high in Pd and Ni concentrations inhibits diffusion of Cu and Al in the ball bond during the high temperature and high humidity test, making it possible to reduce the growth rate of $Cu_9Al_4$, which is a corrodible intermetallic compound. That is, it is presumed that the bonding wire according to the embodiment of the present invention exhibited high bonding reliability due to coexistence of Pd and Ni in the interface of the ball bond. Here, high bonding reliability was not provided by the Pd covering alone or inclusion of Ni alone in the bonding wire. A mere combination of the Pd covering and inclusion of Ni did not provide high bonding reliability either.

To achieve the bonding reliability improvement effect described above, it is necessary to appropriately control each of the Ni concentration in the entire wire, the thickness of the Pd coating layer, and the thickness of the Cu surface layer. That is, the bonding reliability improvement effect is achieved when: the Ni concentration in the entire wire is 0.1 wt. % or above, the thickness of the Pd coating layer is 0.0150 μm or above, and the thickness of the Cu surface layer is from 0.0005 μm to 0.0070 μm both inclusive. Here, when the Ni concentration in the entire wire was less than 0.1 wt. % or the thickness of the Cu surface layer was less than 0.0005 μm, the region high in Ni concentration was formed insufficiently in the interface of the ball bond, failing to achieve a sufficient bonding reliability improvement effect. When the thickness of the Pd coating layer was less than 0.015 μm or the thickness of the Cu surface layer was larger than 0.0070 μm, the region high in Pd concentration was formed insufficiently in the ball bonding interface, failing to achieve a sufficient bonding reliability improvement effect.

Effectiveness of the bonding wire according to the embodiment of the present invention for capillary wear resistance and surface flaw resistance will be described. The bonding wire according to the embodiment of the present invention can simultaneously improve capillary wear resistance and surface flaw resistance by including a Cu alloy core material, a Pd coating layer formed on the surface of the Cu alloy core material, and a Cu surface layer formed on a surface of the Pd coating layer and containing Ni. Consequently, the bonding wire according to the embodiment of the present invention can satisfy the capillary wear resistance and surface flaw resistance required by on-vehicle devices.

The reason why the bonding wire according to the embodiment of the present invention can improve the capillary wear resistance is that the formation of a Cu surface layer on the surface of the Pd coating layer has the effect of reducing the hardness of the bonding wire surface. This is because Cu is lower in hardness than Pd, making it possible to reduce the frictional force acting on a contact between the surface of the bonding wire and the capillary. However, mere existence of the Cu surface layer, which is soft, on the Pd coating layer will result in the increase of surface flaws. As a technique for solving this problem, it is useful to include Ni in the bonding wire. When Ni is included in the bonding wire, Ni exists in the Cu surface layer formed on an outer layer of the bonding wire, increasing the hardness of the Cu surface layer. Consequently, excellent surface flaw resistance is available, and at the same time, even when the hardness of the Cu surface layer is increased by the existence of Ni, because the Cu surface layer is softer than the Pd coating layer, there is no fear that the capillary wear resistance will be reduced.

Conditions in which the excellent capillary wear resistance and surface flaw resistance described above are simultaneously available are that the Ni concentration in the entire wire is from 0.1 wt. % to 1.2 wt. % both inclusive, that the thickness of the Pd coating layer is 0.150 μm or below, and that the thickness of the Cu surface layer is 0.0005 μm or above. Here, when the Ni concentration in the entire wire was less than 0.1 wt. %, the Cu surface layer was soft, failing to achieve a sufficient surface flaw resistance improvement effect. When the thickness of the Cu surface layer was less than 0.0005 μm, the effect of reducing the hardness of the bonding wire surface was small, failing to achieve a sufficient capillary wear resistance improvement effect. When the Ni concentration in the entire wire is higher than 1.2 wt. %, the hardness of the entire bonding wire increases, reducing the capillary wear resistance, which may make the bonding wire unsuitable for practical use. When the thickness of the Pd coating layer is greater than 0.150 μm, even if a Cu surface layer is formed on the bonding wire surface, the impact of the hardness of the Pd coating layer on capillary wear becomes dominant, reducing the capillary wear resistance, which may make the bonding wire unsuitable for practical use. Here, formation of the Pd coating layer alone, inclusion of Ni in the bonding wire alone, or formation of the Cu surface layer alone did not provide excellent capillary wear resistance and surface flaw resistance simultaneously. Even when only two of these three conditions were satisfied, similarly it was not possible to provide excellent capillary wear resistance and surface flaw resistance simultaneously.

Thus, in order to provide the bonding reliability as well as excellent capillary wear resistance and surface flaw resistance required of the bonding wire for on-vehicle devices, it is necessary that the bonding wire includes: a Cu alloy core material; a Pd coating layer formed on a surface of the Cu alloy core material; and a Cu surface layer formed on a surface of the Pd coating layer, wherein the bonding wire for semiconductor device contains Ni, a concentration of the Ni in the entire wire is 0.1 to 1.2 wt. %, the Pd coating layer is 0.015 to 0.150 µm in thickness, and the Cu surface layer is 0.0005 to 0.0070 µm in thickness. From the perspective of further improving the bonding reliability, capillary wear resistance, and surface flaw resistance, preferably a lower limit of the concentration of Ni in the entire wire is 0.2 wt. % or above, and more preferably 0.3 wt. % or above, 0.4 wt. % or above, 0.5 wt. % or above, or 0.6 wt. % or above. Preferably an upper limit of the concentration of Ni in the entire wire is 1.1 wt. % or below, and more preferably 1.0 wt. % or below. Preferably a lower limit of the thickness of the Pd coating layer is 0.020 µm or above, 0.022 µm or above, 0.024 µm or above, or 0.025 µm or above. Preferably an upper limit of the thickness of the Pd coating layer is 0.140 µm or below, 0.130 µm or below, 0.120 µm or below, 0.110 µm or below, or 0.100 µm or below. Preferably a lower limit of the thickness of the Cu surface layer is 0.0006 µm or above, 0.0008 µm or above, or 0.0010 µm or above. Preferably an upper limit of the thickness of the Cu surface layer is 0.0065 µm or below, 0.0060 µm or below, or 0.0055 µm or below.

The bonding wire according to the present invention may include an alloy coating layer between the Pd coating layer and the Cu surface layer. The alloy coating layer contains Au and Pd. When the bonding wire according to the present invention includes an alloy coating layer, preferably the thickness of the alloy coating layer is in a range of 0.0005 to 0.0500 µm. This further improves bonding reliability and wedge bondability of the bonding wire. Presumably, the reason why the formation of the alloy coating layer improves bonding reliability in high temperature and high humidity environments is that Au is supplied from the alloy coating layer to the bonding interface of the ball bond and a thickened layer is formed by an Au—Ni—Pd ternary alloy in conjunction with Pd and Ni, making it possible to reduce the growth rate of a corrodible compound. The reason why the formation of the alloy coating layer improves wedge bondability is that Au is superior to Pd in oxidation resistance and sulfur resistance, making diffusion of metals in a bonding interface with an electrode on the side of an external lead less liable to be obstructed by impurities. Here, when the thickness of the alloy coating layer is less than 0.0005 µm, a sufficient effect of improving bonding reliability and wedge bondability is not available. When the thickness of the alloy coating layer is larger than 0.0500 µm, ball formability is reduced, which may make the bonding wire unsuitable for practical use. Preferably a lower limit of the thickness of the alloy coating layer is 0.0006 µm or above, and more preferably 0.0008 µm or above, 0.0010 µm or above, 0.0015 µm or above, or 0.0020 µm or above. Preferably an upper limit of the thickness of the alloy coating layer is 0.0480 µm or below, and more preferably 0.0460 µm or below, 0.0450 µm or below, or 0.0400 µm or below. Therefore, in one embodiment, the bonding wire includes: a Cu alloy core material; a Pd coating layer formed on a surface of the Cu alloy core material; an alloy coating layer formed on a surface of the Pd coating layer, and a Cu surface layer formed on a surface of the alloy coating layer, wherein the bonding wire for semiconductor device contains Ni, a concentration of the Ni in the entire wire is 0.1 to 1.2 wt. %, the Pd coating layer is 0.015 to 0.150 µm in thickness, and the Cu surface layer is 0.0005 to 0.0070 µm in thickness. According to a preferred embodiment, the alloy coating layer is 0.0005 to 0.0500 µm in thickness.

In the bonding wire according to the present invention, from the perspective of improving loop formability, preferably the Cu alloy core material further contains at least one or more elements selected from among Zn, In, Pt, and Pd. Preferably, a concentration of the element(s) contained in the Cu alloy core material is 0.05 to 0.50 wt. %. This makes it possible to improve straightness of loops required in high-density packaging and reduce loop height variation. Presumably, this is because, since the Cu alloy core material contains at least one or more elements selected from among Zn, In, Pt, and Pd, yield strength of the bonding wire improves, making it possible to inhibit deformation of the bonding wire. In improving straightness of loops and reducing loop height variation, the higher the strength of the Cu alloy core material, the more effective it is, and layer structure improvement such as increase in the thickness of the Pd coating layer cannot achieve sufficient effects. When a concentration of at least one or more elements contained in the Cu alloy core material by being selected from among Zn, In, Pt, and Pd is less than 0.05 wt. %, the above effect cannot be achieved sufficiently, and when the concentration is higher than 0.50 wt. %, the bonding wire hardens, making deformation of a wedge bond insufficient, which may pose a problem of reduced wedge bondability. Preferably a lower limit of the concentration of the element(s) contained in the Cu alloy core material is 0.06 wt. % or above, 0.08 wt. % or above, or 0.10 wt. % or above. Preferably an upper limit of the concentration of the element(s) contained in the Cu alloy core material is 0.48 wt. % or below, 0.46 wt. % or below, or 0.45 or wt. % below. Preferably the total concentration of the elements contained in the Cu alloy core material is in the above range.

From the perspective of improving the shape of the ball bond, preferably the bonding wire according to the present invention further contains at least one or more elements selected from among B, P, Mg, and Sn. Preferably, a concentration of the element(s) in the entire wire is 1 to 110 wt. ppm. This makes it possible to improve collapsed shape of the ball bond required in high-density packaging, i.e., to improve circularity of the ball bond. Presumably, this is because the addition of the element(s) allows grain size of the ball to be refined, making it possible to inhibit deformation of the ball. When the concentration of the element(s) in the entire wire is less than 1 wt. ppm, the above effect cannot be achieved sufficiently, and when the concentration is higher than 110 wt. ppm, the wire hardens and wedge bondability is reduced, which may make the bonding wire unsuitable for practical use.

Preferably a lower limit of the concentration of the element(s) in the entire wire is 3 wt. ppm or above, 5 wt. ppm or above, or 10 wt. ppm or above. Preferably an upper limit of the concentration of the element(s) in the entire wire is 105 wt. ppm or below, 100 wt. ppm or below, or 90 wt. ppm or below. Preferably the total concentration of the elements is in the above range.

From the perspective of improving ball bonding strength just after bonding preferably the bonding wire according to the present invention further contains at least one or more elements selected from among Ga and Ge. Preferably, the concentration of the element(s) in the entire wire is 0.02 to 1.2 wt. %. This makes it possible to improve the immediate post-bonding ball bond bonding strength required in high-density packaging. Presumably, this is because the addition of the element(s) increases the hardness of the ball mainly due to a solid solution strengthening effect of the ball, making it possible to efficiently transmit ultrasound and other energy that is supplied to the bond during ball bonding. When the concentration of the element(s) in the entire wire is less than 0.02 wt. %, the above effect cannot be achieved sufficiently, and when the concentration is higher than 1.2 wt. %, the wire hardens and wedge bondability is reduced, which may make the bonding wire unsuitable for practical use. Preferably a lower limit of the concentration of the element(s) in the entire wire is 0.03 wt. % or above, 0.05 wt. % or above, or 0.08 wt. % or above. Preferably an upper limit of the concentration of the element(s) in the entire wire is 1.1 wt. % or below, 1.0 wt. % or below, or 0.9 wt. % or below. Preferably the total concentration of the elements is in the above range.

Note that as a result of heat treatments during a production process, atoms diffuse in interfaces of the Cu alloy core material, Pd coating layer, alloy coating layer, and Cu surface layer of the bonding wire, which may result in formation of an alloy layer having a concentration gradient. That is, the Pd coating layer may contain incidental impurities of Pd, and elements making up the Cu alloy core material inside of the Pd coating layer. Furthermore, when the alloy coating layer exists on an outer side of the Pd coating layer, the Pd coating layer may contain the incidental impurities of Pd, the elements making up the Cu alloy core material on the inner side of the Pd coating layer, and the elements making up the alloy coating layer on the outer side of the Pd coating layer. In addition to Au and Pd, the alloy coating layer may contain the incidental impurities of Au and Pd, and the elements making up the Cu alloy core material. The Cu surface layer may contain the elements making up the Pd coating layer, alloy coating layer, and Cu alloy core material.

Description will be given of a case in which the bonding wire is made up of the Cu alloy core material, Pd coating layer, and Cu surface layer. A boundary between the Cu alloy core material and Pd coating layer was determined based on the Pd concentration. The location with a Pd concentration of 70 at. % was taken as the boundary, and a region with a Pd concentration of 70 at. % or above was determined to be the Pd coating layer while a region with a Pd concentration lower than 70 at. % was determined to be the Cu alloy core material. A basis for this is that when the Pd concentration is 70 at. % or above, a characteristic improvement effect can be expected from a structure of the Pd coating layer. Also, the characteristic improvement effect can be achieved even if the surface of the Cu alloy core material is not covered completely with the Pd coating layer. Preferably the area occupied by the Pd coating layer makes up 60% or more of the surface area of the Cu alloy core material, and more preferably 80 to 100% of the surface area. The boundary between the Pd coating layer and Cu surface layer was determined based on the Cu concentration. The location with a Cu concentration of 3 at. % was taken as the boundary, and a region with a Cu concentration of from 3 at. % (inclusive) to 50 at. % (exclusive) was determined to be the Cu surface layer. A basis for this is that when the Cu concentration is from 3 at. % (inclusive) to 50 at. % (exclusive), a characteristic improvement effect can be expected from a structure of the Cu surface layer. Here, when the Cu concentration is 50 at. % or above, the surface of the wire becomes soft, reducing the surface flaw resistance and thereby failing to provide characteristics of the Cu surface layer.

Next, description will be given of a case in which the bonding wire is made up of the Cu alloy core material, Pd coating layer, alloy coating layer, and Cu surface layer. A boundary between the Cu alloy core material and Pd coating layer was determined based on the Pd concentration. Starting from the side of the Cu alloy core material, the location in which the Pd concentration became 70 at. % for the first time was taken as the boundary, and a region with a Pd concentration of 70 at. % or above was determined to be the Pd coating layer while a region with a Pd concentration lower than 70 at. % was determined to be the Cu alloy core material. A boundary between the Pd coating layer and alloy coating layer was determined based on the Au concentration. Starting from the side of the Pd coating layer, the location in which the Au concentration became 10 at. % for the first time was taken as the boundary, and a region with an Au concentration of 10 at. % or above and a Pd concentration of 60 at. % or above was determined to be the alloy coating layer while a region with an Au concentration lower than 10 at. % was determined to be the Pd coating layer. A basis for this is that a characteristic improvement effect can be expected from structures of the Pd coating layer and alloy coating layer defined by the above standards. Also, the characteristic improvement effect can be achieved even if the surface of the Cu alloy core material is not covered completely with the Pd coating layer. Preferably the area occupied by the Pd coating layer makes up 60% or more of the surface area of the Cu alloy core material, and more preferably 80 to 100% of the surface area. The characteristic improvement effect can be achieved even if the surface of the Pd coating layer is not covered completely with the alloy coating layer. Preferably the area occupied by the alloy coating layer makes up 60% or more of the surface area of the Pd coating layer, and more preferably 70 to 100% of the surface area. Note that the surface areas of the Cu alloy core material and Pd coating layer can be approximated by the surface area of the bonding wire. The boundary between the alloy coating layer and Cu surface layer was determined based on the Cu concentration. Starting from the side of the alloy coating layer, the location in which the Cu concentration became 3 at. % for the first time was taken as the boundary, and a region with a Cu concentration of from 3 at. % (inclusive) to 50 at. % (exclusive) was determined to be the Cu surface layer. A basis for this is that when the Cu concentration is from 3 at. % (inclusive) to 50 at. % (exclusive), a characteristic improvement effect can be expected from a structure of the Cu surface layer. Here, when the Cu concentration is 50 at. % or above, the surface of the wire becomes soft, reducing the surface flaw resistance and thereby failing to provide characteristics of the Cu surface layer.

From the perspective of taking better advantage of the effect of the present invention, a maximum concentration of Pd in the Pd coating layer is 97 at. % or above, preferably 98 at. % or above, and more preferably 98.5 at. % or above, 99.0 at. % or above, 99.5 at. % or above, or 100 at. %.

In the Pd coating layer, preferably the thickness of a region with a Pd concentration of 97.0 at. % or above is 0.040 μm or below, and more preferably 0.035 μm or below, 0.030 μm or below, 0.025 μm or below, 0.020 μm or below, 0.015 μm or below, 0.010 μm or below, or 0.005 μm or below.

Regarding the concentrations of the metallic elements in the Pd coating layer, alloy coating layer, and Cu surface layer, the ratios of the respective metallic elements to the total sum of the metallic elements making up these layers are used herein while gas components such as C, O, N, H, Cl and S, nonmetallic elements, and the like in the neighborhood of the surface are excluded. A method for conducting analysis while shaving the bonding wire in a depth direction from the surface by sputtering or the like or a method for conducting line analysis, point analysis, and the like by exposing a wire section is useful for concentration analyses of Zn, In, Pt, and Pd in the Cu alloy core material, Pd coating layer, alloy coating layer, Cu surface layer, and Cu alloy core material. As analyzers used for these concentration analyses, an auger electron spectroscope (AES) provided on a scanning electron microscope or an energy dispersive X-ray (EDX) analyzer provided on a transmission electron microscope are available for use. Abundance ratios of the Pd coating layer and alloy coating layer to the surface area of the bonding wire can be measured by conducting line analysis or surface analysis while shaving the bonding wire surface in the depth direction. As a method for exposing a wire section, mechanical polishing, an ion etching process, or the like can be used. For concentration analysis of elements contained in the entire bonding wire, an ICP emission spectrophotometer and ICP mass spectrometer can be used in addition to the methods described above.

(Production Method)

An example of a production method for the bonding wire according to the embodiment of the present invention will be described. The bonding wire is produced by producing the Cu alloy for use as the core material, followed by processing the Cu alloy into a thin wire, forming the Pd coating layer, forming an Au layer on the Pd coating layer as required, and carrying out intermediate heat treatment and final heat treatment. As a processing method, a technique known as a wire drawing process can be used, where the wire drawing process involves processing the wire by passing the wire through a jig called a die. After the Pd coating layer and Au layer are formed, the wire drawing process and intermediate heat treatment may be carried out again. Detailed description will be given of a method for producing the Cu alloy core material, methods for forming the Pd coating layer, alloy coating layer, and Cu surface layer, and methods for intermediate heat treatment and final heat treatment.

The Cu alloy used as the core material is obtained by melting and then solidifying Cu serving as a raw material, together with elements to be added. Preferably the purity of the Cu serving as a raw material is 99.99 wt. % or above and the purity of the elements to be added is 99 wt. % or above. This is to prevent unintended elements mixed into the Cu alloy core material and thereby causing a problem such as increased electric resistance. An arc furnace, high-frequency furnace, resistance heating furnace, or the like can be used for the melting. To prevent admixture of atmospheric gases such as $O_2$, $N_2$, and $H_2$, preferably the melting is done in a vacuum atmosphere or in an inert atmosphere such as Ar or $N_2$.

Methods for forming the Pd coating layer and Au layer will be described. As a method for forming the Pd coating layer and Au layer on the surface of the Cu alloy core material, a plating method, vapor deposition method, or the like can be used. Regarding the plating method, either an electrolytic plating process or electroless plating process can be used. Electrolytic plating called strike plating and flash plating have high plating rates and provide good adhesion to undercoating. Solutions used for electroless plating are classified into a substitution type and reduction type. Substitution plating alone is enough for a small thickness, but for a large thickness, it is useful to apply reduction plating in stages after substitution plating. Regarding the vapor deposition method, physical adsorption such as a sputtering process, an ion plating process, and vacuum deposition as well as chemical absorption such as plasma CVD are available for use. Any of the processes is a dry type, which eliminates the need for cleaning after formation of the Pd coating layer and Au layer, and thus there is no need to worry about surface contamination during cleaning.

In forming the Pd coating layer and Au layer, it is useful to form these layers on a large-diameter Cu alloy core material and then repeat wire drawing multiple times until a desired wire diameter is obtained. Concrete examples of techniques for forming the Pd coating layer and Au layer on a large-diameter Cu alloy core material include a technique for forming the Pd coating layer and Au layer while continuously running the wire in an electrolytic plating solution or a technique for forming the Pd coating layer and Au layer by immersing the large-diameter Cu alloy core material in an electrolytic or electroless plating bath. As heat treatment is carried out after formation of the Pd coating layer and Au layer, Pd in the Pd coating layer diffuses in the Au layer, thereby forming an alloy coating layer. Instead of forming the alloy coating layer through heat treatment after formation of the Au layer, the alloy coating layer may be deposited from the beginning.

Next, a method for forming the Cu surface layer will be described. An effective method for forming the Cu surface layer involves forming the Pd coating layer and Au layer on a large-diameter Cu alloy core material, followed by wire drawing, and causing Cu in the Cu alloy core material to diffuse in surfaces of the Pd coating layer and alloy coating layer via intermediate heat treatment. Diffusion rates of Cu in the Pd coating layer and alloy coating layer can be controlled by heat treatment temperature and heat treatment time. Here, if the heat treatment temperature is too low or the heat treatment time is too short, Cu diffusion becomes insufficient and the Cu surface layer is not formed sufficiently. Conversely, if the heat treatment temperature is too high or the heat treatment time is too long, the Cu surface layer becomes too thick or the thickness of the Pd coating layer and alloy coating layer becomes difficult to control. Therefore, in order to form the Cu surface layer, it is necessary to use an appropriate heat treatment temperature and heat treatment time for the intermediate heat treatment.

A method of forming the Cu surface layer by final heat treatment other than intermediate heat treatment is conceivable. From the perspective of achieving straightness of loops required in high-density packaging, the method of forming the Cu surface layer by intermediate heat treatment is suitable. This is because if heat treatment is carried out in the final heat treatment in a temperature range necessary for formation of the Cu surface layer, the grain size of the Cu alloy core material becomes coarse and soft, failing to provide the straightness of loops required in high-density packaging. On the other hand, if the grain size of the Cu alloy core material becomes coarse in the intermediate heat treatment, effects such as improved workability are available in a subsequent wire drawing process.

Preferably the intermediate heat treatment and final heat treatment are carried out in a vacuum atmosphere or in an inert atmosphere such as Ar or $N_2$ to prevent oxidation and sulfuration of the bonding wire. For efficient production, a method of heating while continuously running the wire can be used in the intermediate heat treatment and final heat treatment.

(Variations)

The present invention is not limited to the above embodiment, and may be changed as appropriate within the spirit and scope of the present invention.

2. Examples

The bonding wire according to the embodiment of the present invention will be described concretely below by showing examples.

(Sample)

First, a method for creating samples will be described. The Cu used as a raw core material had a purity of 99.99 wt. % or above, with the balance being composed of incidental impurities. The Ni, Zn, In, Pt, Pd, B, P, Mg, Sn, Ga, Ge used had a purity of 99 wt. % or above, with the balance being incidental impurities.

The Cu alloy of the core material was produced as follows: materials were charged into a cylindrically-shaped carbon crucible with a diameter of ϕ 3 to 6 mm, melted by heating to 1090 to 1300° C. in vacuum or in an inert atmosphere such as $N_2$ or Ar using a high-frequency furnace, and then furnace-cooled. The resulting cylindrical alloy of ϕ 3 to 6 mm in diameter was formed to a diameter of ϕ 0.9 to 1.2 mm by a drawing process, and then a wire with a diameter of ϕ 300 to 350 μm was created by a continuous wire drawing process and the like using a die. A commercially available lubricant was used in the wire drawing process, and a wire drawing rate of 20 to 150 m/min was used. An acid cleaning process was performed using hydrochloric acid to remove an oxide film from the wire surface, and then the Pd coating layer was formed to a thickness of 0.2 to 2.3 μm, covering the entire surface of the Cu alloy of the core material. Furthermore, on some of the wires, the Au layer was formed on the Pd coating layer to a thickness of 0.007 to 0.800 μm. An electrolytic plating process was used in forming the Pd coating layer and Au layer. As a Pd plating solution and Au plating solution, commercially available plating solutions were used.

Subsequently, a wire with a diameter of ϕ 70 to 150 μm was created by further performing a wire drawing process and the like and intermediate heat treatment was carried out. The heat treatment temperature for the intermediate heat treatment was 510 to 600° C., the wire feed rate was 10 to 100 m/min, and the heat treatment time was 0.4 to 2.0 seconds. After the intermediate heat treatment, the wire was drawn to a final wire diameter of ϕ 20 μm and then subjected to the final heat treatment. The heat treatment temperature of the final heat treatment was 250 to 470° C., the wire feed rate was 20 to 200 m/min, and the heat treatment time was 0.2 to 1.0 seconds. The heat treatment methods of the intermediate heat treatment and final heat treatment were carried out while continuously running the wire and supplying Ar gas. The configurations of the samples created using the above procedures are shown in Table 1-1, Table 1-2, and Table 2.

The concentration analyses of Zn, In, Pt, and Pd in the Pd coating layer, alloy coating layer, Cu surface layer, and Cu alloy core material were conducted using an AES while sputtering the bonding wire with Ar ions in the depth direction from the surface. The thicknesses of the Pd coating layer, alloy coating layer, and Cu surface layer as well as the concentrations of Zn, In, Pt, and Pd in the Cu alloy core material were found from the resulting concentration profile in the depth direction (the unit of depth was converted into a $SiO_2$ equivalent unit). When the bonding wire was made of the Cu alloy core material, Pd coating layer, and Cu surface layer, the boundary between the Cu alloy core material and Pd coating layer was determined based on the Pd concentration. The location with a Pd concentration of 70 at. % was taken as the boundary, and a region with a Pd concentration of 70 at. % or above was determined to be the Pd coating layer while a region with a Pd concentration lower than 70 at. % was determined to be the Cu alloy core material. The boundary between the Pd coating layer and Cu surface layer was determined based on the Cu concentration. The location with a Cu concentration of 3 at. % was taken as the boundary, and a region with a Cu concentration of from 3 at. % (inclusive) to 50 at. % (exclusive) was determined to be the Cu surface layer. Also, when the bonding wire was made of the Cu alloy core material, Pd coating layer, alloy coating layer, and Cu surface layer, the boundary between the Cu alloy core material and Pd coating layer was determined based on the Pd concentration. The location with a Pd concentration of 70 at. % was taken as the boundary, and a region with a Pd concentration of 70 at. % or above was determined to be the Pd coating layer while a region with a Pd concentration lower than 70 at. % was determined to be the Cu alloy core material. The boundary between the Pd coating layer and alloy coating layer was determined based on the Au concentration. The location with an Au concentration of 10 at. % was taken as the boundary, and a region with an Au concentration of 10 at. % or above and a Pd concentration of 60 at. % or above was determined to be the alloy coating layer while a region with an Au concentration lower than 10 at. % was determined to be the Pd coating layer. The boundary between the alloy coating layer and Cu surface layer was determined based on the Cu concentration. The location with a Cu concentration of 3 at. % was taken as the boundary, and a region with a Cu concentration of from 3 at. % (inclusive) to 50 at. % (exclusive) was determined to be the Cu surface layer. Three arbitrary sites of each sample were analyzed and the averages of the resulting values are shown in Table 1-1, Table 1-2, and Table 2. The concentrations of Ni, B, P, Mg, Sn, Ga, Ge, and other elements contained in the entire bonding wire were measured with an ICP emission spectrophotometer.

The abundance ratio of the Pd coating layer to the surface area of the Cu alloy core material and the abundance ratio of the alloy coating layer to the surface area of the Pd coating layer were calculated based on the ratio of the area occupied by the Pd coating layer or alloy coating layer to the measured area by conducting surface analysis using an AES while sputtering the bonding wire in the depth direction from the surface with Ar ions. Preferably the region on which the surface analysis is conducted measures 40 μm or above in the longitudinal direction of the wire and 10 μm or above in the transverse direction of the wire.

TABLE 1-1

| | Sample No. | Ni concentration in entire wire (wt %) | Film thickness of Pd coating layer (μm) | Film thickness of Cu surface layer (μm) | Film thickness of alloy coating layer including Au and Pd (μm) | Concentrations of elements contained in Cu alloy core material | | | |
|---|---|---|---|---|---|---|---|---|---|
| | | | | | | Zn concentration (wt. %) | In concentration (wt. %) | Pt concentration (wt. %) | Pd concentration (wt. %) |
| Example | 1 | 0.1 | 0.016 | 0.0005 | — | — | — | — | — |
| Example | 2 | 0.1 | 0.050 | 0.0010 | — | — | — | — | — |
| Example | 3 | 0.1 | 0.120 | 0.0070 | — | — | — | — | — |
| Example | 4 | 0.1 | 0.146 | 0.0013 | — | — | — | — | — |
| Example | 5 | 0.5 | 0.131 | 0.0009 | — | — | — | — | — |
| Example | 6 | 0.5 | 0.065 | 0.0017 | — | — | — | — | — |
| Example | 7 | 0.5 | 0.078 | 0.0068 | — | — | — | — | — |
| Example | 8 | 0.5 | 0.144 | 0.0065 | — | — | — | — | — |
| Example | 9 | 0.8 | 0.045 | 0.0010 | — | — | — | — | — |
| Example | 10 | 0.8 | 0.096 | 0.0070 | — | — | — | — | — |
| Example | 11 | 0.8 | 0.120 | 0.0011 | — | — | — | — | — |
| Example | 12 | 0.8 | 0.150 | 0.0009 | — | — | — | — | — |
| Example | 13 | 1.2 | 0.044 | 0.0009 | — | — | — | — | — |
| Example | 14 | 1.2 | 0.132 | 0.0070 | — | — | — | — | — |
| Example | 15 | 1.2 | 0.099 | 0.0010 | — | — | — | — | — |
| Example | 16 | 1.2 | 0.089 | 0.0068 | — | — | — | — | — |
| Example | 17 | 0.6 | 0.016 | 0.0005 | 0.0005 | — | — | — | — |
| Example | 18 | 0.7 | 0.018 | 0.0070 | 0.0010 | — | — | — | — |
| Example | 19 | 0.8 | 0.015 | 0.0008 | 0.0500 | — | — | — | — |
| Example | 20 | 0.7 | 0.020 | 0.0068 | 0.0006 | — | — | — | — |
| Example | 21 | 1.1 | 0.019 | 0.0050 | 0.0210 | — | — | — | — |
| Example | 22 | 1.1 | 0.019 | 0.0006 | 0.0470 | — | — | — | — |
| Example | 23 | 0.7 | 0.020 | 0.0008 | — | 0.05 | — | — | — |
| Example | 24 | 0.8 | 0.021 | 0.0009 | 0.0012 | 0.50 | — | — | — |

| | Sample No. | Concentration of each element in entire wire | | | | | |
|---|---|---|---|---|---|---|---|
| | | B concentration (wt. ppm) | P concentration (wt. ppm) | Mg concentration (wt. ppm) | Sn concentration (wt. ppm) | Ga concentration (wt. %) | Ge concentration (wt. %) |
| Example | 1 | — | — | — | — | — | — |
| Example | 2 | — | — | — | — | — | — |
| Example | 3 | — | — | — | — | — | — |
| Example | 4 | — | — | — | — | — | — |
| Example | 5 | — | — | — | — | — | — |
| Example | 6 | — | — | — | — | — | — |
| Example | 7 | — | — | — | — | — | — |
| Example | 8 | — | — | — | — | — | — |
| Example | 9 | — | — | — | — | — | — |
| Example | 10 | — | — | — | — | — | — |
| Example | 11 | — | — | — | — | — | — |
| Example | 12 | — | — | — | — | — | — |
| Example | 13 | — | — | — | — | — | — |
| Example | 14 | — | — | — | — | — | — |
| Example | 15 | — | — | — | — | — | — |
| Example | 16 | — | — | — | — | — | — |
| Example | 17 | — | — | — | — | — | — |
| Example | 18 | — | — | — | — | — | — |
| Example | 19 | — | — | — | — | — | — |
| Example | 20 | — | — | — | — | — | — |
| Example | 21 | — | — | — | — | — | — |
| Example | 22 | — | — | — | — | — | — |
| Example | 23 | — | — | — | — | — | — |
| Example | 24 | — | — | — | — | — | — |

TABLE 1-2

| | Sample No. | Ni concentration in entire wire (wt %) | Film thickness of Pd coating layer (μm) | Film thickness of Cu surface layer (μm) | Film thickness of alloy coating layer including Au and Pd (μm) | Concentrations of elements contained in Cu alloy core material | | | |
|---|---|---|---|---|---|---|---|---|---|
| | | | | | | Zn concentration (wt. %) | In concentration (wt. %) | Pt concentration (wt. %) | Pd concentration (wt. %) |
| Example | 25 | 0.8 | 0.017 | 0.0012 | — | — | 0.07 | — | — |
| Example | 26 | 0.7 | 0.019 | 0.0055 | 0.0011 | — | 0.43 | — | — |
| Example | 27 | 0.7 | 0.018 | 0.0070 | 0.0012 | — | — | 0.06 | — |

TABLE 1-2-continued

| Sample No. | Ni concentration in entire wire (wt %) | Film thickness of Pd coating layer (μm) | Film thickness of Cu surface layer (μm) | Film thickness of alloy coating layer including Au and Pd (μm) | Zn concentration (wt. %) | In concentration (wt. %) | Pt concentration (wt. %) | Pd concentration (wt. %) |
|---|---|---|---|---|---|---|---|---|
| Example 28 | 0.7 | 0.025 | 0.0013 | 0.0016 | — | — | 0.44 | — |
| Example 29 | 0.7 | 0.029 | 0.0070 | 0.0018 | — | — | — | 0.08 |
| Example 30 | 0.8 | 0.027 | 0.0014 | 0.0028 | — | — | — | 0.44 |
| Example 31 | 0.8 | 0.025 | 0.0010 | — | — | 0.05 | — | 0.31 |
| Example 32 | 0.7 | 0.022 | 0.0011 | 0.0014 | — | 0.10 | — | 0.31 |
| Example 33 | 0.8 | 0.030 | 0.0010 | — | 0.10 | — | 0.30 | — |
| Example 34 | 0.8 | 0.042 | 0.0011 | 0.0014 | 0.20 | — | 0.20 | — |
| Example 35 | 0.7 | 0.035 | 0.0009 | 0.0012 | — | — | — | — |
| Example 36 | 0.8 | 0.034 | 0.0070 | 0.0010 | — | — | — | — |
| Example 37 | 0.8 | 0.031 | 0.0009 | 0.0011 | | | | |
| Example 38 | 0.9 | 0.033 | 0.0012 | 0.0011 | | | | |
| Example 39 | 0.8 | 0.028 | 0.0070 | 0.0012 | | | | |
| Example 40 | 0.8 | 0.015 | 0.0055 | 0.0012 | — | — | — | — |
| Example 41 | 0.9 | 0.025 | 0.0012 | 0.0021 | 0.45 | — | — | — |
| Example 42 | 0.7 | 0.032 | 0.0070 | 0.0022 | — | 0.26 | — | — |
| Example 43 | 0.7 | 0.029 | 0.0012 | 0.0015 | — | 0.15 | 0.30 | — |
| Example 44 | 0.8 | 0.030 | 0.0010 | 0.0012 | — | — | — | — |
| Example 45 | 0.9 | 0.029 | 0.0009 | 0.0013 | | | | |
| Example 46 | 0.9 | 0.027 | 0.0065 | 0.0014 | | | | |
| Example 47 | 1.0 | 0.031 | 0.0013 | 0.0019 | | | | |
| Example 48 | 1.0 | 0.030 | 0.0012 | 0.0015 | | | | |

| | Concentration of each element in entire wire | | | | | |
|---|---|---|---|---|---|---|
| Sample No. | B concentration (wt. ppm) | P concentration (wt. ppm) | Mg concentration (wt. ppm) | Sn concentration (wt. ppm) | Ga concentration (wt. %) | Ge concentration (wt. %) |
| Example 25 | — | — | — | — | — | — |
| Example 26 | — | — | — | — | — | — |
| Example 27 | — | — | — | — | — | — |
| Example 28 | — | — | — | — | — | — |
| Example 29 | — | — | — | — | — | — |
| Example 30 | — | — | — | — | — | — |
| Example 31 | — | — | — | — | — | — |
| Example 32 | — | — | — | — | — | — |
| Example 33 | — | — | — | — | — | — |
| Example 34 | — | — | — | — | — | — |
| Example 35 | 7 | — | — | — | — | — |
| Example 36 | 110 | — | — | — | — | — |
| Example 37 | | 10 | | | | |
| Example 38 | | 90 | | | | |
| Example 39 | | | 40 | | | |
| Example 40 | — | — | — | 90 | — | — |
| Example 41 | 20 | — | — | — | — | — |
| Example 42 | — | 50 | — | — | — | — |
| Example 43 | 10 | 50 | — | — | — | — |
| Example 44 | — | — | — | — | 0.02 | — |
| Example 45 | — | — | — | — | — | 0.02 |
| Example 46 | — | — | — | — | 1.1 | — |
| Example 47 | | | | | | 1.1 |
| Example 48 | | | | | 0.5 | 0.5 |

TABLE 2

| Sample No. | Ni concentration in entire wire (wt %) | Film thickness of Pd coating layer (μm) | Film thickness of Cu surface layer (μm) | Film thickness of alloy coating layer including Au and Pd (μm) | Concentrations of elements contained in Cu alloy core material | | | |
|---|---|---|---|---|---|---|---|---|
| | | | | | Zn concentration (wt. %) | In concentration (wt. %) | Pt concentration (wt. %) | Pd concentration (wt. %) |
| Comparative example 1 | 0.2 | — | — | — | — | — | — | — |
| Comparative example 2 | 0.2 | 0.030 | — | — | — | — | — | — |
| Comparative example 3 | 0.08 | 0.035 | 0.0015 | — | — | — | — | — |
| Comparative example 4 | 1.3 | 0.035 | 0.0018 | — | — | — | — | — |
| Comparative example 5 | 0.3 | 0.013 | 0.0017 | — | — | — | — | — |
| Comparative example 6 | 0.3 | 0.160 | 0.0019 | | | | | |

TABLE 2-continued

| | Sample No. | | | | | | | | |
|---|---|---|---|---|---|---|---|---|---|
| Comparative example | 7 | 0.3 | 0.032 | 0.0004 | — | — | — | — | — |
| Comparative example | 8 | 0.3 | 0.027 | 0.0075 | — | — | — | — | — |

| | | Concentration of each element in entire wire | | | | | |
|---|---|---|---|---|---|---|---|
| | Sample No. | B concentration (wt. ppm) | P concentration (wt. ppm) | Mg concentration (wt. ppm) | Sn concentration (wt. ppm) | Ga concentration (wt. %) | Ge concentration (wt. %) |
| Comparative example | 1 | — | — | — | — | — | — |
| Comparative example | 2 | — | — | — | — | — | — |
| Comparative example | 3 | — | — | — | — | — | — |
| Comparative example | 4 | — | — | — | — | — | — |
| Comparative example | 5 | — | — | — | — | — | — |
| Comparative example | 6 | — | — | — | — | — | — |
| Comparative example | 7 | — | — | — | — | — | — |
| Comparative example | 8 | — | — | — | — | — | — |

(Evaluation Method)

By creating samples for evaluation of bonding reliability, bonding reliability was determined from the bond life of the ball bonds exposed to a high temperature and high humidity environment.

The samples for evaluation of bonding reliability were created as follows: electrodes were created by forming a 1.0-μm-thick pure Al film on a Si substrate on a typical metal frame, ball-bonded using a commercially available wire bonder, and sealed by an epoxy resin. The wire diameter of the bonding wire used in the evaluation was 20 μm. The epoxy resin contained water-soluble chlorine ions with a concentration of 40 wt. ppm. The balls were formed by supplying $N_2+5\%$ $H_2$ gas at a flow rate of 0.4 to 0.6 L/min, and the ball diameter was in a range of ϕ 34 to 36 μm.

The created samples for evaluation of bonding reliability were exposed to a high temperature and high humidity environment at a temperature of 130° C. and relative humidity of 85% using an unsaturated pressure cooker tester. By conducting a shear test of the ball bonds every 100 hours, the bond life of the ball bonds was defined as the time at which the value of the shear strength became ½ the shear strength obtained initially. After the high temperature and high humidity test, the ball bonds were exposed by removing resin by acid treatment before conducting the shear test.

As a shear tester, a tester made by DAGE Co., Ltd. was used. As the value of shear strength, an average value of measured values of ball bonds at ten locations selected at random was used. In the above evaluation, when the bond life was shorter than 250 hours, a triangle mark was given by judging that there was a problem in practical use; when the bond life was 250 to 500 hours, a single circle mark was given by judging that there was no problem in practical use; and when the bond life exceeded 500 hours, a double circle mark was given by judging that the result was particularly excellent. These marks were entered in the "Bonding reliability" fields of Table 3 and Table 4.

The capillary wear resistance was determined based on the number of occurrences of eccentricity after the bonding wire was bonded 5000 times and 100 balls were formed and observed. The capillary used for the evaluations was a commercially available capillary mainly composed of $Al_2O_3$ and generally used to bond a bonding wire with a wire diameter of ϕ 20 μm. The balls were formed by supplying $N_2+5\%$ $H_2$ gas at a flow rate of 0.4 to 0.6 L/min, and the ball diameter was in a range of ϕ 34 to 36 μm. When eccentricity occurred in 3 or more out of 100 balls, a triangle mark was given by judging that there was a problem with capillary wear resistance; and when there were 2 or less defects, a single circle mark was given by judging that it was a good result. These marks were entered in the "Capillary wear resistance" fields of Table 3 and Table 4.

The surface flaw resistance was determined based on the number of surface flaws occurred by observing the bonding wire surface in 100 loop portions after the bonding wire was bonded. The capillary used for the evaluations was a commercially available capillary mainly composed of $Al_2O_3$ and generally used to bond a bonding wire with a wire diameter of ϕ 20 μm. When there were 4 or more surface flaws out of 100 loop portions observed, a triangle mark was given by judging that there was a problem with surface flaw resistance; and when there were 3 or less surface flaws, a single circle mark was given by judging that it was a good result. These marks were entered in the "Surface flaw resistance" fields of Table 3 and Table 4.

Regarding evaluation of the wedge bondability in wedge bonds, determinations were made based on the occurrence frequency of separation in the bonds by bonding 1000 wires to a lead portion of a lead frame. A lead frame with Ag plating to a thickness of 1 to 3 μm was used. In the present evaluation, assuming bonding conditions severer than usual, a stage temperature was set to 150° C., which was lower than a common set temperature range. In the above evaluation, when 6 or more defects occurred, a triangle mark was given by judging that there was a problem; when there were 1 to 5 defects, a single circle mark was given by judging that there was no problem; and when no defect occurred, a double circle mark was given by judging that it was a good result. These marks were entered in the "Wedge bondability" fields of Table 3 and Table 4.

Regarding evaluation of the loop formability, determinations were made based on straightness and height variation.

Regarding loop formation conditions, the loop length was 2 mm and maximum height was 80 µm. The maximum height of the loop was the distance from the surface of the electrode in the ball bond to the highest point of the wire. Regarding evaluation of the straightness, 50 bonding wires were observed per one condition under a scanning electron microscope. When the maximum deviation of the bonding wire from an axis formed by connecting the ball bond to the wedge bond with a straight line was less than 45 µm, the sample was judged to be good; and when the deviation was 45 µm or above, the sample was judged to be defective. Regarding evaluation of the height variation, 50 bonding wires were observed per one condition under a scanning electron microscope and an average height was calculated. When the deviation from the average value was less than ±15 µm, the sample was judged to be good; and when the deviation was ±15 µm or above, the sample was judged to be defective. In the above evaluations, when there were 6 or more defects in terms of either straightness or height variation, a triangle mark was given by judging that there was a problem; when there were 1 to 5 defects, a single circle mark was given by judging that there was no problem; and when no defect occurred, a double circle mark was given by judging that it was a good result. These marks were entered in the "Loop formability" fields of Table 3 and Table 4.

Regarding evaluation of the collapsed shape of ball bonds, the ball bonds resulting from bonding were observed from directly above and determinations were made based on the circularity of the ball bonds. The bonding wire was bonded to an electrode created by forming a 1.0-µm-thick film of an alloy of Al and 0.5% Cu on a Si substrate. An optical microscope was used for observation and 200 ball bonds were observed per one condition. When the collapsed shape of the ball bond was the elliptical one deviated greatly from a perfect circle or had an anisotropic deformation, the collapsed shape was judged to be defective. In the above evaluation, when 6 or more defects occurred, a triangle mark was given by judging that there was a problem; when there were 1 to 5 defects, a single circle mark was given by judging that there was no problem; and when good circularity was obtained in all the ball bonds, a double circle mark was given by judging that the result was particularly excellent. These marks were entered in the "Collapsed shape" fields of Table 3 and Table 4.

The bonding strength of ball bonds just after bonding was measured by a shear test. As the value of shear strength, an average value of measured values of ball bonds at ten locations selected at random was used. In the above evaluation, when the bonding strength per unit bonding area was less than 10 kg/mm$^2$, a triangle mark was given by judging that there was a problem in practical use; when the bonding strength per unit bonding area was 10 kg/mm$^2$ to 12 kg/mm$^2$, a single circle mark was given by judging that there was no problem in practical use; and when the bonding strength per unit bonding area exceeded 12 kg/mm$^2$, a double circle mark was given by judging that the result was particularly excellent. These marks were entered in the "Ball bond bonding strength" fields of Table 3 and Table 4.

TABLE 3

| | Sample No. | Bonding reliability (temperature: 130° C., relative humidity: 85%) | Capillary wear resistance | Surface flaw resistance | Wedge bondability | Loop formability | Collapsed shape | Ball bond bonding strength |
|---|---|---|---|---|---|---|---|---|
| Example | 1 | ○ | ○ | ○ | ○ | ○ | ○ | ○ |
| Example | 2 | ○ | ○ | ○ | ○ | ○ | ○ | ○ |
| Example | 3 | ○ | ○ | ○ | ○ | ○ | ○ | ○ |
| Example | 4 | ○ | ○ | ○ | ○ | ○ | ○ | ○ |
| Example | 5 | ○ | ○ | ○ | ○ | ○ | ○ | ○ |
| Example | 6 | ○ | ○ | ○ | ○ | ○ | ○ | ○ |
| Example | 7 | ○ | ○ | ○ | ○ | ○ | ○ | ○ |
| Example | 8 | ○ | ○ | ○ | ○ | ○ | ○ | ○ |
| Example | 9 | ○ | ○ | ○ | ○ | ○ | ○ | ○ |
| Example | 10 | ○ | ○ | ○ | ○ | ○ | ○ | ○ |
| Example | 11 | ○ | ○ | ○ | ○ | ○ | ○ | ○ |
| Example | 12 | ○ | ○ | ○ | ○ | ○ | ○ | ○ |
| Example | 13 | ○ | ○ | ○ | ○ | ○ | ○ | ○ |
| Example | 14 | ○ | ○ | ○ | ○ | ○ | ○ | ○ |
| Example | 15 | ○ | ○ | ○ | ○ | ○ | ○ | ○ |
| Example | 16 | ○ | ○ | ○ | ○ | ○ | ○ | ○ |
| Example | 17 | ◎ | ○ | ○ | ○ | ○ | ○ | ○ |
| Example | 18 | ◎ | ○ | ○ | ◎ | ○ | ○ | ○ |
| Example | 19 | ◎ | ○ | ○ | ◎ | ○ | ○ | ○ |
| Example | 20 | ◎ | ○ | ○ | ◎ | ○ | ○ | ○ |
| Example | 21 | ◎ | ○ | ○ | ◎ | ○ | ○ | ○ |
| Example | 22 | ◎ | ○ | ○ | ◎ | ○ | ○ | ○ |
| Example | 23 | ○ | ○ | ○ | ○ | ◎ | ○ | ○ |
| Example | 24 | ◎ | ○ | ○ | ◎ | ◎ | ○ | ○ |
| Example | 25 | ○ | ○ | ○ | ◎ | ◎ | ○ | ○ |
| Example | 26 | ◎ | ○ | ○ | ◎ | ◎ | ○ | ○ |
| Example | 27 | ◎ | ○ | ○ | ◎ | ◎ | ○ | ○ |
| Example | 28 | ◎ | ○ | ○ | ◎ | ◎ | ○ | ○ |
| Example | 29 | ◎ | ○ | ○ | ◎ | ◎ | ○ | ○ |
| Example | 30 | ◎ | ○ | ○ | ◎ | ◎ | ○ | ○ |
| Example | 31 | ○ | ○ | ○ | ○ | ◎ | ○ | ○ |
| Example | 32 | ◎ | ○ | ○ | ◎ | ◎ | ○ | ○ |
| Example | 33 | ○ | ○ | ○ | ◎ | ◎ | ○ | ○ |
| Example | 34 | ◎ | ○ | ○ | ◎ | ○ | ○ | ○ |
| Example | 35 | ◎ | ○ | ○ | ◎ | ○ | ◎ | ○ |
| Example | 36 | ◎ | ○ | ○ | ◎ | ○ | ◎ | ○ |
| Example | 37 | ◎ | ○ | ○ | ◎ | ○ | ◎ | ○ |
| Example | 38 | ◎ | ○ | ○ | ◎ | ○ | ◎ | ○ |

TABLE 3-continued

| | Sample No. | Bonding reliability (temperature: 130° C., relative humidity: 85%) | Capillary wear resistance | Surface flaw resistance | Wedge bondability | Loop formability | Collapsed shape | Ball bond bonding strength |
|---|---|---|---|---|---|---|---|---|
| Example | 39 | ◎ | ○ | ○ | ◎ | ○ | ◎ | ○ |
| Example | 40 | ◎ | ○ | ○ | ◎ | ○ | ◎ | ○ |
| Example | 41 | ◎ | ○ | ○ | ◎ | ◎ | ◎ | ○ |
| Example | 42 | ◎ | ○ | ○ | ◎ | ◎ | ◎ | ○ |
| Example | 43 | ◎ | ○ | ○ | ◎ | ◎ | ◎ | ○ |
| Example | 44 | ◎ | ○ | ○ | ◎ | ○ | ○ | ◎ |
| Example | 45 | ◎ | ○ | ○ | ◎ | ○ | ○ | ◎ |
| Example | 46 | ◎ | ○ | ○ | ◎ | ○ | ○ | ◎ |
| Example | 47 | ◎ | ○ | ○ | ◎ | ○ | ○ | ◎ |
| Example | 48 | ◎ | ○ | ○ | ◎ | ○ | ○ | ◎ |

TABLE 4

| | Sample No. | Bonding reliability (temperature: 130° C., relative humidity: 85%) | Capillary wear resistance | Surface flaw resistance | Wedge bondability | Loop formability | Collapsed shape | Ball bond bonding strength |
|---|---|---|---|---|---|---|---|---|
| Comparative example | 1 | △ | ○ | △ | △ | ○ | ○ | ○ |
| Comparative example | 2 | △ | △ | ○ | ○ | ○ | ○ | ○ |
| Comparative example | 3 | △ | △ | △ | ○ | ○ | ○ | ○ |
| Comparative example | 4 | ○ | △ | ○ | ○ | ○ | ○ | ○ |
| Comparative example | 5 | △ | ○ | △ | ○ | ○ | ○ | ○ |
| Comparative example | 6 | ○ | △ | ○ | ○ | ○ | ○ | ○ |
| Comparative example | 7 | △ | △ | ○ | ○ | ○ | ○ | ○ |
| Comparative example | 8 | △ | ○ | △ | ○ | ○ | ○ | ○ |

(Evaluation Results)

The bonding wire in each of Examples 1 to 48 included a Cu alloy core material; a Pd coating layer formed on a surface of the Cu alloy core material; and a Cu surface layer formed on a surface of the Pd coating layer, wherein the bonding wire for semiconductor device contained Ni, a concentration of the Ni in the entire wire was 0.1 to 1.2 wt. %, the Pd coating layer was 0.015 to 0.150 μm in thickness, and the Cu surface layer was 0.0005 to 0.0070 μm in thickness. Consequently, it was confirmed that the bonding wires in Examples 1 to 48 provided good bonding reliability as well as excellent capillary wear resistance and surface flaw resistance. On the other hand, Comparative Examples 1 to 8 show that when a Pd coating layer or Cu surface layer does not exist, or when the Ni concentration, Pd coating layer, or Cu surface layer falls outside the above range even if the Pd coating layer and Cu surface layer exist, sufficient improvement effects cannot be obtained in improving bonding reliability, capillary wear resistance, and surface flaw resistance.

Examples 17 to 22, 24, 26 to 30, 32, and 34 to 48 confirmed that excellent bonding reliability and wedge bondability are available when an alloy covering layer is provided in an interface between the Pd coating layer and Cu surface layer and the alloy coating layer is 0.0005 to 0.0500 μm in thickness.

Examples 23 to 34 and 41 to 43 confirmed that excellent loop formability is available when the Cu alloy core material further contains at least one or more elements selected from among Zn, In, Pt, and Pd and a concentration of the element(s) contained in the Cu alloy core material is 0.05 to 0.50 wt. %.

Examples 35 to 43 confirmed that highly circular collapsed shape of a ball bond is available when the bonding wire further contains at least one or more elements selected from among B, P, Mg, and Sn and a concentration of the element(s) in the entire wire is 1 to 110 wt. ppm.

Examples 1 to 16, 23, 25, 31, and 33 confirmed that good bonding reliability as well as excellent capillary wear resistance and surface flaw resistance are available when the abundance ratio of the Pd coating layer to the surface area of the Cu alloy core material is 60% or above. Examples 17 to 22, 24, 26 to 30, 32, and 34 to 48 confirmed that good bonding reliability as well as excellent capillary wear resistance, surface flaw resistance, excellent bonding reliability, and wedge bondability are available when the abundance ratio of the Pd coating layer to the surface area of the Cu alloy core material is 60% or above and the abundance ratio of the alloy coating layer to the surface area of the Pd coating layer is 60% or above.

Examples 44 to 48 confirmed that excellent bonding strength of ball bonds just after bonding is available when the bonding wire further contains at least one or more elements selected from among Ga and Ge and the concentration of the element(s) in the entire wire is 0.02 to 1.2 wt. %.

The invention claimed is:

1. A bonding wire for a semiconductor device comprising:
   a Cu alloy core material;
   a Pd coating layer formed on a surface of the Cu alloy core material; and
   a Cu surface layer formed on a surface of the Pd coating layer, wherein the bonding wire contains Ni, a concentration of the Ni in the bonding wire is 0.1 to 1.2 wt. %, the Pd coating layer is 0.015 to 0.150 μm in thickness, and the Cu surface layer is 0.0005 to 0.0070 μm in thickness.

2. The bonding wire according to claim 1, further comprising an alloy coating layer between the Pd coating layer and the Cu surface layer, the alloy coating layer containing Au and Pd, wherein the alloy coating layer is 0.0005 to 0.0500 µm in thickness.

3. The bonding wire according to claim 1, wherein the Cu alloy core material further contains at least one or more elements selected from among Zn, In, Pt, and Pd; and a concentration of the one or more elements in the Cu alloy core material is 0.05 to 0.50 wt. %.

4. The bonding wire according to claim 1, wherein the bonding wire further contains at least one or more elements selected from among B, P, Mg, and Sn; and a concentration of the one or more elements in the bonding wire is 1 to 110 wt. ppm.

5. The bonding wire according to claim 1, wherein the bonding wire further contains at least one or more elements selected from among Ga and Ge; and
    a concentration of the one or more elements in the bonding wire is 0.02 to 1.2 wt. %.

\* \* \* \* \*